(12) United States Patent
Dubois

(10) Patent No.: US 11,378,918 B2
(45) Date of Patent: Jul. 5, 2022

(54) METHOD FOR MANUFACTURING A MICROMECHANICAL TIMEPIECE PART AND SAID MICROMECHANICAL TIMEPIECE PART

(71) Applicant: Nivarox-FAR S.A., Le Locle (CH)

(72) Inventor: Philippe Dubois, Marin (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 15/234,147

(22) Filed: Aug. 11, 2016

(65) Prior Publication Data
US 2017/0068219 A1    Mar. 9, 2017

(30) Foreign Application Priority Data

Sep. 8, 2015 (EP) .................................... 15184189

(51) Int. Cl.
*G04B 31/08* (2006.01)
*C23C 14/22* (2006.01)
(Continued)

(52) U.S. Cl.
CPC .............. *G04B 31/08* (2013.01); *B81B 3/007* (2013.01); *B81B 3/0075* (2013.01); *C23C 14/22* (2013.01);
(Continued)

(58) Field of Classification Search
CPC .... G04B 13/02; G04B 13/022; G04B 13/026; G04B 15/14; G04B 19/06; G04B 31/08
See application file for complete search history.

(56) References Cited

U.S. PATENT DOCUMENTS 5,580,834 A  * 12/1996  Pfaff ..................... C04B 35/532
                                                             428/446
7,926,355 B2 *  4/2011  Bannier ................. G04B 35/00
                                                              73/760
(Continued)

FOREIGN PATENT DOCUMENTS

CH           708 998 A1     6/2015
DE    10 2009 046 647 A1    5/2011
(Continued)

OTHER PUBLICATIONS

European Search Report dated May 13, 201 6 in European Application No. 15184189, filed on Sep. 8, 2015 ( with English Translation of categories of Cited Documents).
(Continued)

*Primary Examiner* — Edwin A. Leon
*Assistant Examiner* — Jason M Collins
(74) *Attorney, Agent, or Firm* — Oblon, McClelland, Maier & Neustadt, L.L.P.

(57) ABSTRACT

A method for manufacturing a micromechanical timepiece part starting from a silicon-based substrate, including, providing a silicon-based substrate, forming pores on the surface of at least one part of a surface of the silicon-based substrate of a depth of at least 10 μm, preferably of at least 50 μm, and more preferably of at least 100 μm, the pores being designed in order to open out at the external surface of the micromechanical timepiece part. A micromechanical timepiece part including a silicon-based substrate which has, on the surface of at least one part of a surface of the silicon-based substrate, pores of a depth of at least 10 μm, preferably of at least 50 μm, and more preferably of at least 100 μm, the pores being designed in order to open out at the external surface of the micromechanical timepiece part.

26 Claims, 1 Drawing Sheet

(51) Int. Cl.
*C23C 16/455* (2006.01)
*B81B 3/00* (2006.01)
*G04B 15/14* (2006.01)
*G04B 19/12* (2006.01)

(52) U.S. Cl.
CPC ........ *C23C 16/45525* (2013.01); *G04B 15/14* (2013.01); *G04B 19/12* (2013.01); *B81B 2201/035* (2013.01)

(56) References Cited

U.S. PATENT DOCUMENTS

| | | | | |
|---|---|---|---|---|
| 8,944,676 | B2* | 2/2015 | Conus | G04B 13/022 267/182 |
| 2006/0055097 | A1* | 3/2006 | Conus | G04B 17/066 267/273 |
| 2008/0112274 | A1* | 5/2008 | Bitterli | G04B 13/026 368/238 |
| 2012/0090933 | A1* | 4/2012 | Conus | G04B 13/022 188/371 |
| 2013/0029157 | A1* | 1/2013 | Karapatis | G04B 31/004 428/446 |
| 2013/0286795 | A1* | 10/2013 | Conus | G04B 13/022 368/127 |
| 2014/0066343 | A1* | 3/2014 | Bielecki | C09D 133/08 508/103 |
| 2015/0050556 | A1* | 2/2015 | Liu | C09K 13/08 429/218.1 |
| 2015/0196940 | A1* | 7/2015 | Aizenberg | B05D 5/08 428/141 |

FOREIGN PATENT DOCUMENTS

| | | |
|---|---|---|
| DE | 10 2013 113 380 B3 | 4/2015 |
| EP | 1 705 533 A1 | 9/2006 |
| EP | 2 865 737 A1 | 4/2015 |

OTHER PUBLICATIONS

H. Foll et al. "Formation and Application of Porous Silicon", Materials Science and Engineering R:, Reports, vol. 39, No. 4, 2002, 49 pages.

Walter Lang "Silicon Microstructuring Technology", Materials Science and Engineering R: Reports, vol. 17, No. 1, 1996, 55 pages.

F. Gentile et al. "Fractal structure can explain the increased hydrophobicity of nanoporous silicon films", Microelectronic Engineering, vol. 88, 2011, 4 pages.

* cited by examiner

METHOD FOR MANUFACTURING A MICROMECHANICAL TIMEPIECE PART AND SAID MICROMECHANICAL TIMEPIECE PART

This application claims priority from European Patent application 15184189.7 of Sep. 8, 2015, the entire disclosure of which is hereby incorporated herein by reference.

FIELD OF THE INVENTION

The present invention relates to a method for producing silicon-based micromechanical timepiece parts. The invention likewise relates to a silicon-based, reinforced micromechanical timepiece part which is able in particular to be obtained by such a process.

BACKGROUND OF THE INVENTION

Silicon is a material which is used more and more in the manufacture of micromechanical timepiece parts, in particular parts which remain connected to a silicon-based substrate on which they have been machined.

With respect to the metals or alloys which are used as standard for manufacturing micromechanical timepiece parts, such as toothed wheels, or components of the escapement, silicon has numerous advantages. It is a very hard material of very light weight which makes it therefore possible for it to have very much reduced inertia and consequently to improve the efficiency. Silicon likewise makes it possible to produce complex or monobloc parts.

In order to improve or modify the properties of the silicon, it is known to deposit a layer of a suitable material over the silicon. Thus, in order to improve its tribological properties, diamond is deposited on the silicon, for example by a method of thin-film vapour phase deposition (CVD/PVD).

However these methods have a deposition rate which can prove to be too slow when the thickness of the deposited layer exceeds a few microns. In fact, the deposition rates in CVD machines for example being typically of the order of ten nanometres/minute, this technique is not generally used for the manufacture of a layer greater than a few microns.

It is therefore necessary to propose a method for manufacturing a silicon-based micromechanical timepiece part which makes it possible to achieve rapid deposition of thick layers of a suitable material on the silicon.

Furthermore, silicon-based substrates can be used to produce dials.

The dials of watches or another timepiece part comprise inscriptions or decorative surfaces which make it possible to give information or to highlight the dial. These decorations are traditionally produced by various engraving techniques.

When the dial is produced on a silicon base, it is necessary to propose new techniques in order to produce such inscriptions or decorative surfaces which are easy to implement.

Furthermore, just as the other materials which are used more as standard in clockmaking, the timepiece parts produced from a silicon-based substrate must be lubricated.

It is known to use for example a very fluid lubricant which promotes a low coefficient of friction in the case of low contact pressures. However, this type of lubricant has the disadvantage of having its effect diminished, in particular during higher contact pressures, because of rupture of the lubricant film. It is known that supra-lubrication techniques, based on the formation of polymer brushes deposited on the surface and their impregnation with a lubricant having an affinity with the polymer brushes, make it possible to reduce the friction greatly for a wide range of stresses. These very flexible polymer brushes straighten out again when they are impregnated with the lubricant, thus forming a sort of sponge full of lubricant. According to the friction conditions, during large contact pressures, the fibres can be compressed easily and restore lubricant into the contact. The result of this is the formation of a thicker lubricant film which results in a substantial drop in the coefficient of friction and in wear and tear. However, during stresses of long duration, these polymer brushes finish up being degraded (wear and tear, scratching of the surface), which no longer makes it possible for the polymer brush coating to ensure its function.

It is therefore necessary to propose a new method for lubricating a silicon-based micromechanical timepiece part which makes it possible to contain, on the surface of the timepiece part to be lubricated, sufficient quantities of lubricant in order to reduce the frequency of maintenance services of the timepiece movement comprising said timepiece part.

It is likewise necessary to propose a new method for lubricating a silicon-based micromechanical timepiece part which makes it possible to create lubrication conditions allowing a significant reduction in wear and tear and in the coefficient of friction so as to increase reliability, efficiency and consequently the power reserve of the clock movement comprising this timepiece part, and in fact for a wide range of stresses.

SUMMARY OF THE INVENTION

To this end, the present invention relates to a method for manufacturing a micromechanical timepiece part starting from a silicon-based substrate, comprising, in order, the steps of:
a) providing a silicon-based substrate
b) forming pores on the surface of at least one part of a surface of said silicon-based substrate with a depth of at least 10 µm, preferably of at least 50 µm, and more preferably of at least 100 µm, said pores being designed in order to open out at the external surface of the micromechanical timepiece part.

The method according to the invention makes it possible, thanks to the preceding formation of pores on the surface of the substrate, to improve various properties of a silicon-based substrate used in micromechanical timepiece parts.

The present invention relates likewise to a micromechanical timepiece part which is able to be obtained by the method as defined above.

The present invention likewise relates to a micromechanical timepiece part comprising a silicon-based substrate which has, on the surface of at least one part of a surface of said silicon-based substrate, pores of a depth of at least 10 µm, preferably of at least 50 µm, and more preferably of at least 100 µm, said pores being designed in order to open out at the external surface of the micromechanical timepiece part.

According to a first embodiment, the pores can be filled entirely with a layer of a material chosen from diamond, diamond-like carbon (DLC), silicon oxide, silicon nitride, ceramics, polymers and mixtures thereof, of a thickness at least equal to the depth of the pores. A surface layer of said material can be provided on the surface of the silicon-based substrate and on the surface of the pores filled with the material.

According to another embodiment, the pores can be designed in order to form a decorative surface, said decorative surface being covered with a coating comprising a metallisation layer and/or a transparent oxide layer chosen from the group comprising $SiO_2$, $TiO_2$, $ZrO_2$, $HfO_2$, $Ta_2O_5$, $VO_2$.

According to another embodiment, the pores can comprise a tribological agent. The timepiece part can also comprise, between the pores, silicon-based fibres, the silicon-based fibres comprising walls covered with at least one moistening agent for the tribological agent, the silicon-based fibres being impregnated with the tribological agent. The silicon-based fibres can likewise comprise walls covered with at least one polymer brush, the silicon-based fibres and the polymer brush being impregnated with the tribological agent.

According to another embodiment, the pores can be provided on the silicon-based substrate in order to form at least one super-hydrophobic zone with an epilame effect relative to at least one zone of the silicon-based substrate which does not comprise pores and on which a tribological agent is applied.

BRIEF DESCRIPTION OF THE DRAWINGS

The aims, advantages and features of the present invention will appear more clearly in the following detailed description of various embodiments of the invention, given solely by way of non-limiting example and illustrated by the appended drawings in which.

DETAILED DESCRIPTION OF THE INVENTION

The method for manufacturing a micromechanical timepiece part starting from a silicon-based according to the invention comprises, in order, the steps of:
a) providing a silicon-based substrate
b) forming pores starting from the surface of at least one part of a surface of said silicon-based substrate of a depth of at least 10 μm, preferably at least 50 μm, and more preferably of at least 100 μm, said pores being designed in order to open out at the external surface of the micromechanical timepiece part.

Figure 1:
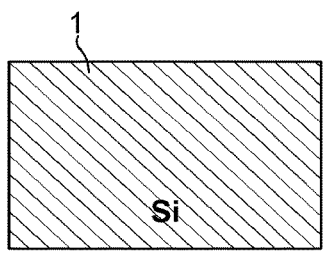
FIGS. 1 to 3 illustrate schematically the steps of a manufacturing method according to the invention.

The silicon-based substrate is chosen as a function of the micromechanical timepiece part which is to be formed. The final form of the silicon-based substrate, as a function of the micromechanical timepiece part which is to be manufactured, is given before or after implementation of the method of the invention. In the present invention, the expression <<silicon-based substrate>> designates both a silicon layer in a substrate and a substrate made of silicon. Preferably, as illustrated in FIG. 1, the silicon-based substrate 1 is a silicon wafer or an SOI wafer (Silicon-on-Insulator). The pores can be formed both on the surface parallel to the plane of the substrate and on the surface perpendicular to the plane of the substrate.

Advantageously, this step b) can be achieved by a method chosen from the group comprising a method by electrochemical etching, a method of the <<Stain-etch>> type, and a method of the <<MAC-Etch>> type.

The method by electrochemical etching can be a method by electrochemical anodisation. Its implementation requires the use of an electrochemical bath containing hydrofluoric acid in aqueous solution or mixed with ethanol in concentrations of 1 to 10%. An electrical current and electrodes are necessary to create electrochemical conditions which cause the etching of the silicon. According to the electrochemical conditions, various types of pores can be obtained. Such a method is known to the person skilled in the art and does not require detailed information here.

The method of the <<Stain-etch>> type is based on moist etching of the silicon resulting directly in the formation of porous silicon. Typically, the etching takes place with an $HF/HNO_3/H_2O$ solution with a ratio $HF:HNO_3$ of 50-500:1. This method has the advantage of not requiring any electrical supply in the bath. Such a method is known to the person skilled in the art and does not require detailed information here.

Preferably, step b) is achieved by a method of the <<MAC-Etch>> type. This method is based on the use of particles of noble metals in order to catalyse local chemical etching reactions. Typically, a very thin layer (10-50 nm) of a noble metal (gold, silver, platinum) is deposited and structured in a random manner or by lift-off, etching, laser, etc. For preference, the noble metal is gold. More particularly, there can advantageously be used particles of gold in solution in an $HF/H_2O_2$ mixture. The size of the particles can be between 5 and 1,000 nm. The structuring can be obtained by lithography of the gold, etching or lift-off. Another option is evaporation or cathodic pulverisation (sputtering) of a very fine, non-closed layer (5-30 nm). A thermal treatment will be able to contribute to the formation of islets of gold.

When the silicon with the layer of noble metal is immersed in an aqueous solution of an $HF/H_2O_2$ mixture, the noble metal locally catalyses the dissolution of the silicon. This etching solution can typically comprise between 4 ml:1 ml:8 ml (48% $HF:30\%$ $H_2O_2:H_2O$) and 4 ml:1 ml:40 ml (48% $HF:30\%$ $H_2O_2:H_2O$). The dissolution of the silicon is produced for preference under the metal, the latter penetrating then progressively into the silicon. This reaction can be continued over great depths (>100 μm) according to propagation modes essentially influenced by the orientation of the silicon crystal, the surface disposition, the doping and the chemistry of the bath. The method of the <<MAC-Etch>> type has the advantage of not requiring an electrical supply in the bath whilst allowing the formation of pores of very great depth (<100 μm) in the silicon. It is therefore particularly suitable for use for SOI wafers as substrate which are generally used for the manufacture of timepiece components.

The person skilled in the art knows the parameters of the methods described above to be implemented in order that the pores formed in the silicon-based substrate have a suitable geometry and size.

In particular, the pores can advantageously have an aspect factor (depth:diameter ratio) between 1 and 200.

Preferably, the pores can advantageously have a depth greater than 200 μm and more preferably greater than 300 μm.

Figure 2:
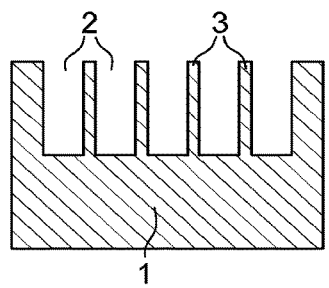

As illustrated in FIG. 2, the formation of pores 2 in the silicon-based substrate 1 over a certain depth causes formation, between the pores 2, of silicon-based pillars 3 over the same depth. Preferably, when considering the silicon-based pillars as having a circular section, the pores 2 are formed such that the projected surface of the silicon-based pillars 3 is less than 79% of the apparent total surface in order not to have silicon-based pillars which are touching.

Figure 3:
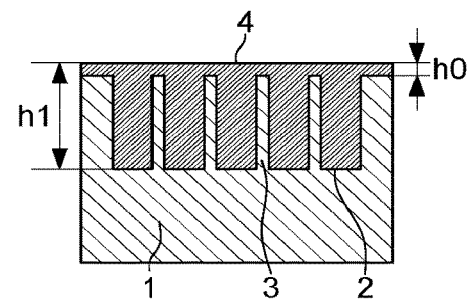

According to a first embodiment of the method of the invention, with reference to FIGS. 1 to 3, the silicon-based porous substrate is used to create an actual substrate surface which is very much larger than the initial surface, and consequently to increase greatly the apparent deposition rate of a suitable material.

According to this first embodiment, the method according to the invention comprises, after step b) a step c) consisting of filling entirely the pores 2 formed in the silicon-based substrate 1 during step b), with a material chosen from diamond, diamond-like carbon (DLC), silicon oxide, silicon nitride, ceramics, polymers and mixtures thereof, in order to form, in the pores, a layer of said material of a thickness at least equal to the depth of the pores.

Thus, the method according to the invention makes it possible to manufacture, in the surface of the silicon-based substrate, a thick layer of a suitable material in a time which is rapid and greatly reduced relative to a deposition on the planar surface of a similar, but not porous, substrate.

This step c) is effected directly after step b), without any intermediate step, so that the material deposited in the pores is in direct contact with the walls of said pores.

Preferably, step c) is achieved by a method chosen from the group comprising methods of thin-film deposition, such as methods of chemical vapour deposition (CVD), physical vapour deposition (PVD), thin atomic layer deposition (ALD) and thermal oxidation. These methods are known to the person skilled in the art and do not require detailed information here. However it can be specified that, when step c) is achieved by a PVD deposition, the aspect factor of the pores in the silicon-based substrate is preferably less than or equal to 4:1. When step c) is achieved by a CVD or MOVD deposition (metal organic chemical vapour deposition), the aspect factor of the pores in the silicon-based substrate is preferably less than or equal to 50:1. Moreover, for a deposition by PVD, the deposition rate will preferably be between 0.1 and 5 nm/s. For a deposition by CVD or MOCVD, the deposition rate will preferably be between 0.01 and 10 nm/s. For a deposition by ALD, the deposition rate will be for example 0.01 nm/s. Furthermore, thermal oxidation is particularly advantageous for reducing the proportion of silicon in a silicon substrate, the silicon being consumed by growth at the rate of approx. 50% of the thickness of the layer. Thus, the person skilled in the art can dimension the pores requiring to be formed in a silicon substrate in order to allow replacement to 100% of the silicon by $SiO_2$, resulting thus in the formation of a very thick layer of $SiO_2$ in a very short space of time.

Advantageously, the method according to the invention comprises, after step c), a step d) of forming a surface layer 4 of said material on the surface of the substrate 1 and of the pores 2 filled with the material. More particularly, this surface layer 4 can be obtained by prolonging the deposition of the material according to step c) so as not only to fill the pores 2 entirely with the material but likewise then to deposit said material over the pores 2 filled with the material and also over the pillars 3 in order to form a complete layer 4 of said material of thickness h0, as shown in FIG. 3. A composite layer of thickness h1 comprising pillars 3, pores 2 filled with material and the complete layer 4 are thus obtained. Thus, there can be for example a ratio h0/h1 of the order of 10%.

Hence, the method according to the invention makes it possible to obtain a micromechanical timepiece part comprising a thick composite layer based on deposited silicon/material, or even a thick layer of deposited material when all the silicon has been replaced.

The formation of pores starting from the surface of the substrate during step b) makes it possible to create a very great corrugation in order to create an actual surface which is far greater than the initial surface, without pores. The person skilled in the art can choose the geometry of the pores and also the deposition time of the material in the pores, in order to manufacture, in the surface of the silicon, a thick layer in a greatly reduced time relative to deposition over a planar surface. More particularly, the person skilled in the art can choose the geometry and the size of the pores so as to:
- obtain complete filling of the pores during deposition of the material,
- facilitate the flow of the gases
- obtain the desired ratio of volume between the layer of deposited material and the silicon pores. It is possible for example to manufacture the porous silicon with a porosity of more than 90% if necessary.

For example for certain deposition methods, such as CVD and PVD, the deposition rate is inclined to be slower at the bottom of the pores. It is then possible to provide conical pores (wider at the surface than in depth) in order to compensate for this phenomenon associated with the flow of the gases.

Thus, with sufficient gas supply in the pores, the method according to the invention makes it possible to obtain a silicon/material composite layer, deposited with a thickness h1 in a deposition time close to that necessary for obtaining a complete layer of material of thickness h0 corresponding to the surface layer 4.

The method according to the invention can advantageously be implemented for the manufacture of components of the silicon-based escapement, such as the escapement wheel and the pallets, by forming thick layers of diamond by CVD.

The method according to the invention can likewise be implemented for the manufacture of components of the silicon-based escapement, by forming thick layers of SiO2, almost solid if the method by thermal oxidation is used for the deposition of SiO2.

The method according to the invention can likewise be implemented in order to create rapidly local layers with great thickness in depth in the silicon, by combining it with the structuring of zones made of porous silicon.

According to a second embodiment of the method of the invention, the pores 2 are formed according to step b) on one zone of the silicon-based substrate 1 corresponding to a decorative surface to be produced. The porous silicon-based substrate is therefore used to create, over the micromechanical timepiece part, a decorative porous silicon surface of very dark colour, approaching black. The pores 2 are designed so as to open out at the external surface of the micromechanical timepiece part in order to form a surface visible for the user.

The person skilled in the art knows the parameters of the methods described above to be implemented in order that the pores formed in the silicon-based substrate have a suitable geometry and size for obtaining a porous silicon zone which has a very high capacity for absorption of light, in particular the visible range, and is anti-reflective.

In particular, by assimilating the pores, in the plane of the timepiece part, to orifices of a circular section, said pores can preferably have a diameter between 10 nm and 1,000 nm.

The obtained colour zone is used as decorative surface on the micromechanical timepiece part. There is intended, by decorative surface, for example a drawing, a motif or an inscription, such as numbers, or any other decoration.

The method according to the invention can optionally comprise, after step b), a step e) consisting of depositing at least one coating on the decorative surface made of porous silicon and obtained according to step b).

Advantageously, this coating deposited in step e) can comprise a metallisation layer based on at least one of the elements chosen from the group comprising Cr, Ti, Ag, Pt, Cu, Ni, Pd, Rh. Preferably, the metallisation layer is a fine layer, of a thickness less than 50 nm.

Advantageously the coating deposited in step e) can likewise comprise a transparent oxide layer, such as one of the oxides chosen from the group comprising $SiO_2$, $TiO_2$, $ZrO_2$, $HfO_2$, $Ta_2O_5$, $VO_2$, or mixtures thereof. The metallisation layer or the oxide layer can be used alone and be deposited for example directly over the porous Si, or the two layers can be connected, the oxide layer then covering the metallisation layer. The thickness of the oxide layer is preferably between 100 nm and 2,000 nm.

The coating of a metallisation layer and of a transparent oxide layer on the decorative surface made of porous silicon makes it possible to obtain a decorative surface of interferential colours.

The method according to the invention can advantageously be implemented for manufacturing silicon-based timepiece parts, such as dials.

According to another embodiment of the method of the invention, the formation of pores starting from the surface of the silicon-based substrate makes it possible to form a porous, silicon-based superstructure which has a certain degree of flexibility and is able to accommodate various pressure conditions by deforming. Furthermore, this type of structure has cavities which make it possible to contain, in a durable manner, a large reserve of lubricant.

Furthermore, in the case where polymer brushes are deposited on the porous, silicon-based superstructure, the obtained coating is able to be filled with lubricant and to restore it when these polymer brushes are compressed. This coating likewise assists penetration of the lubricant into the cavities of the porous, silicon-based superstructure.

According to this embodiment, the pores 2 are formed starting from the surface of said silicon-based substrate 1 over a zone of the silicon-based substrate 1 corresponding to a zone to be lubricated by a tribological agent. The pores can be formed preferably over the surface perpendicular to the plane of the substrate, i.e. on the sides of the micromechanical timepiece part which are subject to friction, but likewise over the surface parallel to the plane of the substrate.

According to this embodiment, a step f) is provided, after step b), consisting of depositing in the pores 2, between the pillars 3, a tribological agent. The tribological agent is a lubricant and can be liquid, for example in the form of an aqueous solution, or dry. Preferably, said tribological agent is a perfluorocarbonated polymer, such as polytetrafluoroethylene (PTFE), or any other suitable tribological agent or lubricant.

According to a first embodiment, the tribological agent is deposited, according to step f), directly in the pores 2 of the silicon-based substrate. This step f) can be achieved by a method of thin-film deposition, such as CVD, iCVD, PECVD. A suitable thermal treatment can be applied in order to polymerise the tribological agent, at temperatures of the order of 100° C. to 300° C. Thus, large quantities of tribological agent can be stored close to the surface of the silicon-based substrate, whilst preserving an apparent hardness of the surface which is relatively increased because of the silicon.

In a particularly advantageous manner, the parameters of the method of forming pores 2 in the silicon-based substrate 1, according to step b), are chosen in order that the pores 2 have a suitable geometry and size so that the pillars 3, formed between the pores 2, form silicon-based fibres 3'. These fibres 3' have an aspect factor (depth:diameter ratio) between 5 and 100. The fibres form a flexible superstructure and are then impregnated with a tribological agent chosen in order to a facilitate wetting of the pores, according to step b) of the method according to the invention.

A substrate comprising silicon-based fibres can be used according to two other embodiments of this embodiment of the method of the invention.

Figure 4:
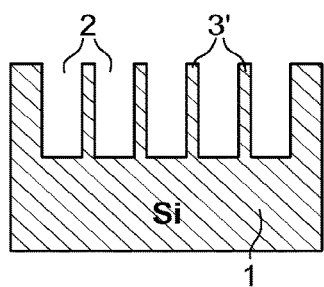
FIGS. 4 to 6 illustrate schematically the steps of another embodiment of the manufacturing method according to the invention.
Figure 5:
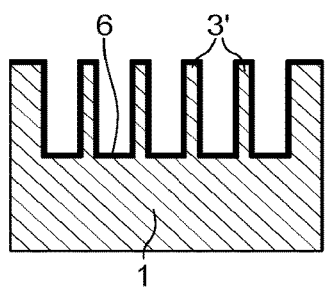
Figure 6:
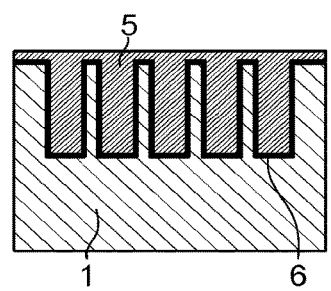

More particularly with reference to FIGS. 4 to 6, according to a second embodiment, it is provided, according to step b), to produce, in a silicon-based substrate 1, pores 2 in order to form, between the pores 2, pillars 3 in the form of fibres 3', as shown in FIG. 4. There is therefore provided, between steps b) and f), a step g) of depositing at least one wetting agent 6 for the tribological agent on the walls of the silicon-based fibres 3'. The wetting agent 6 is chosen in order to facilitate wetting and penetration of the tribological agent. It is applied in order to form a very thin layer (a few nanometres) in order to functionalise the walls of the silicon-based fibres 3'. Then the fibres 3' are impregnated with a tribological agent 5, according to step f), the tribological agent 5 being chosen in order to facilitate the wetting of the pores 2.

Figure 7:
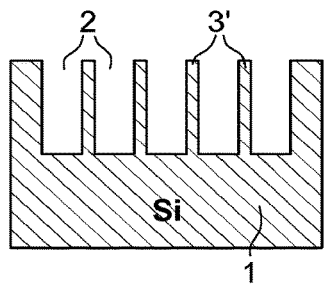
FIGS. 7 to 9 illustrate schematically the steps of another embodiment of the manufacturing method according to the invention.
Figure 8:
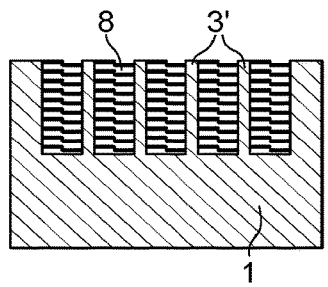
Figure 9:
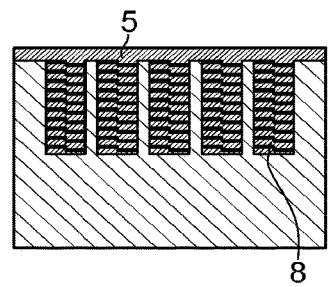

With reference to FIGS. 7 to 9, according to a third embodiment, it is provided, according to step b), to produce in a silicon-based substrate 1 pores 2 in order to form, between the pores 2, pillars 3 in the form of fibres 3', as shown in FIG. 7. Between steps b) and f), a step h) is therefore provided of depositing at least one polymer brush 8 on the walls of the silicon-based fibres 3'. Such a polymer brush 8 is described for example in publications WO 2012/152512 and WO 2014/009059. The polymer brushes have fibres of a smaller length than those of the silicon-based fibres so that the polymer fibres are protected by the silicon-based fibres which are more mechanically resistant. Then the silicon-based fibres 3' and the polymer brushes 8 are impregnated with a tribological agent 5, according to step f), the tribological agent 5 being chosen in order to facilitate wetting.

This method embodiment makes it possible to manufacture fibres, directly in the material of the silicon-based substrate, with controlled geometries and properties of mechanical bending which make it possible, in the case of using polymer brushes, to maintain the supra-lubrication behaviour over a wide range of friction conditions whilst increasing reliability. Thus, the method according to the invention makes it possible to compensate for the lack of mechanical resistance of the polymer brushes which are usually used in supra-lubrication. The formed structure of silicon-based fibres constitutes a lubricant reservoir which is able to restore a sufficient quantity of lubricant into the contact as a function of the stresses.

The geometry of the pores and of the silicon-based fibres can be optimised as a function of the intended friction conditions and tribological objectives. The structuring of the silicon-based substrate can range from silicon-based fibres to open and disordered pores forming a spongy layer.

According to another embodiment of the method according to the invention, the pores 2 are formed on the silicon-based substrate 1 in order to form at least one superhydrophobic zone with an epilame effect relative to at least one zone of the silicon-based substrate which does not comprise pores and on which a tribological agent is applied. This effect can be reinforced by localised functionalisation.

What is claimed is:

1. A method for manufacturing a micromechanical timepiece part, comprising, in order:
    providing a silicon-based substrate;
    forming pores along a given direction on at least one part of a surface of said silicon-based substrate of a depth of at least 10 µm, said pores being closed at one end thereof and open at another end thereof located at the surface, said pores separated by one or more flexible pillars; and
    after the forming of the pores, filling said pores entirely with a first material and depositing the first material over said pores filled with said first material and over said pillars to form a surface layer of said first material,
    wherein the silicon-based substrate includes at least one hydrophobic zone and at least another zone, the at least one hydrophobic zone including the pores, the at least another zone not comprising the pores, a tribological agent applied on the at least one hydrophobic zone, and
    wherein the tribological agent is said first material.

2. The method according to claim 1, wherein the depth of the pores is at least 50 µm.

3. The method according to claim 2, wherein the depth of the pores is at least 100 µm.

4. The method according to claim 1, wherein the pores are formed over a zone of the silicon-based substrate corresponding to a decorative surface.

5. The method according to claim 4, wherein the method comprises, after the forming, depositing at least one coating over the decorative surface.

6. The method according to claim 5, wherein the coating comprises a metallisation layer.

7. The method according to claim 5, wherein the coating comprises a transparent oxide layer chosen from the group comprising $SiO_2$, $TiO_2$, $ZrO_2$, $HfO_2$, $Ta_2O_5$, and $VO_2$.

8. The method according to claim 1, wherein the pores are designed in order to form, between the pores, silicon-based fibres which have an aspect factor (depth:diameter ratio) between 5 and 100.

9. The method according to claim 8, comprising, after the providing, depositing at least one polymer brush on walls of the silicon-based fibres,
    wherein said at least one polymer brush is configured to be impregnated with said first material.

10. The method according to claim 1, wherein the tribological agent is a perfluorocarbonated polymer.

11. The method according to claim 1, wherein the forming is achieved by a method chosen from the group comprising a method by electrochemical etching, a Stain-etch method and a MAC-Etch method.

12. The method according to claim 11, in which the forming is achieved by the MAC-Etch method.

13. The method according to claim 1, wherein the pores have an aspect factor (depth:diameter ratio) between 1 and 200.

14. The method according to claim 1, wherein the pores have a depth greater than 200 µm.

15. The method according to claim 14, wherein the pores have a depth greater than 300 µm.

16. The method according to claim 1, wherein the silicon-based substrate is a silicon wafer or an SOI (Silicon-on-Insulator) wafer.

17. A micromechanical timepiece part obtained by the method according to claim 1.

18. The method according to claim 1, wherein the pores extend in a parallel manner.

19. A micromechanical timepiece part comprising:
    a silicon-based substrate including, on at least one part of a surface of said silicon-based substrate, pores of a depth of at least 10 µm, said pores being closed at one end thereof and open at another end thereof located at the surface, said pores formed along a given direction and separated by one or more flexible pillars, said pores entirely filled with a first material,
    wherein the first material is deposited over said pores filled with said first material and over said pillars to form a surface layer of said first material,
    wherein the silicon-based substrate includes at least one hydrophobic zone and at least another zone, the at least one hydrophobic zone including the pores, the at least another zone not comprising the pores, a tribological agent applied on the at least one hydrophobic zone, and
    wherein the tribological agent is said second material.

20. The micromechanical timepiece part according to claim 19, wherein the depth of the pores is at least 50 µm.

21. The micromechanical timepiece part according to claim 20, wherein the depth of the pores is at least 100 µm.

22. The micromechanical timepiece part according to claim 19, wherein the pores are designed in order to form a decorative surface, and wherein said decorative surface is covered with a coating comprising a metallisation layer and/or a transparent oxide layer chosen from the group comprising $SiO_2$, $TiO_2$, $ZrO_2$, $HfO_2$, $Ta_2O_5$, and $VO_2$.

23. The micromechanical timepiece part according to claim 19, wherein the pores comprise a tribological agent.

24. The micromechanical timepiece part according to claim 23, comprising, between the pores, silicon-based fibres, the silicon-based fibres comprising walls covered by at least one polymer brush, the silicon-based fibres and the polymer brush being impregnated with the tribological agent.

25. The micromechanical timepiece part according to claim 19, wherein the pores extend in a parallel manner.

26. A micromechanical timepiece part comprising:
    a silicon-based substrate,
    a hydrophobic zone formed on at least a first part of a surface of said silicon-based substrate and having pores of a depth of at least 10 µm, said pores being closed at one end thereof and open at another end thereof located at the surface, said pores formed along a given direction and separated by one or more pillars having a circular cross section, said pores containing a first material,
    another zone not including the pores formed on at least a second part of a surface of said silicon-based substrate,
    the first material deposited over said pores containing said first material and over said pillars to fill the pores and to form a surface layer of the first material, and
    the first material comprising a tribological agent.

* * * * *